United States Patent [19]

Rockett, Jr.

[11] 4,119,961

[45] Oct. 10, 1978

[54] CCD BINARY-TO-GRAY CODE GENERATOR

[75] Inventor: Leonard Richard Rockett, Jr., Cranbury, N.J.

[73] Assignee: RCA Corporation, New York, N.Y.

[21] Appl. No.: 863,920

[22] Filed: Dec. 23, 1977

[51] Int. Cl.² .......................................... H03K 13/25
[52] U.S. Cl. .............................. 340/347 DD; 357/24; 307/221 D; 307/216
[58] Field of Search .................. 340/347 DD; 357/24; 307/221 D, 216

[56] References Cited

PUBLICATIONS

Sequin "Charge Transfer Devices" ©1975, pp. 270–274.

Hnatek "A User's Handbook of D/A and A/D Converters" ©1976, p. 77.

Primary Examiner—Charles D. Miller
Attorney, Agent, or Firm—H. Christoffersen; Samuel Cohen

[57] ABSTRACT

N charge signals $B_{N-1} \ldots B_0$ in N channels represent an N digit binary code. The charge signal $B_{N-1}$ representing the most significant binary digit is sensed to produce an output charge signal $G_{N-1}$ representing the most significant Gray code digit. The N-1 remaining charge signals are processed by, in each case, adding a charge signal representing one binary digit $B_j$ to a charge signal $B_{j-1}$ representing the binary digit of next lower significance in EXCLUSIVE OR fashion to obtain the Gray code digit $G_{j-1}$.

6 Claims, 8 Drawing Figures

CCD BINARY-TO-GRAY CODE GENERATOR

The present invention relates to binary-to-Gray code conversion.

There is often a need in various digital signal processing and communications applications to translate signals representing a binary code to signals representing a Gray code. The present application describes systems for performing this function which readily can be integrated, which operate at relatively high speed and which are relatively simple in construction. In the drawing.

Figure 1:
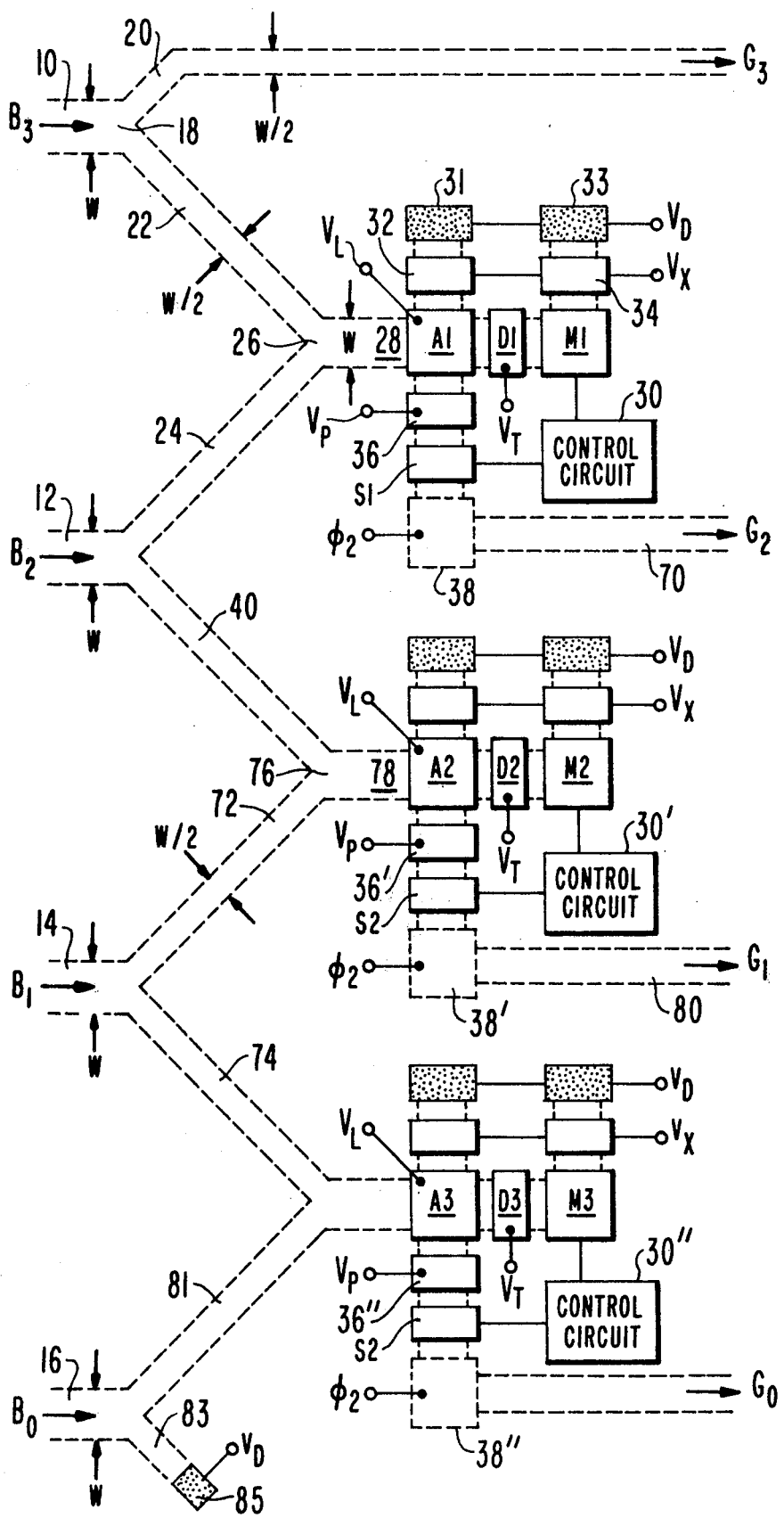
FIG. 1 is a schematic showing of a binary-to-Gray code converter embodying the invention.
Figure 6:
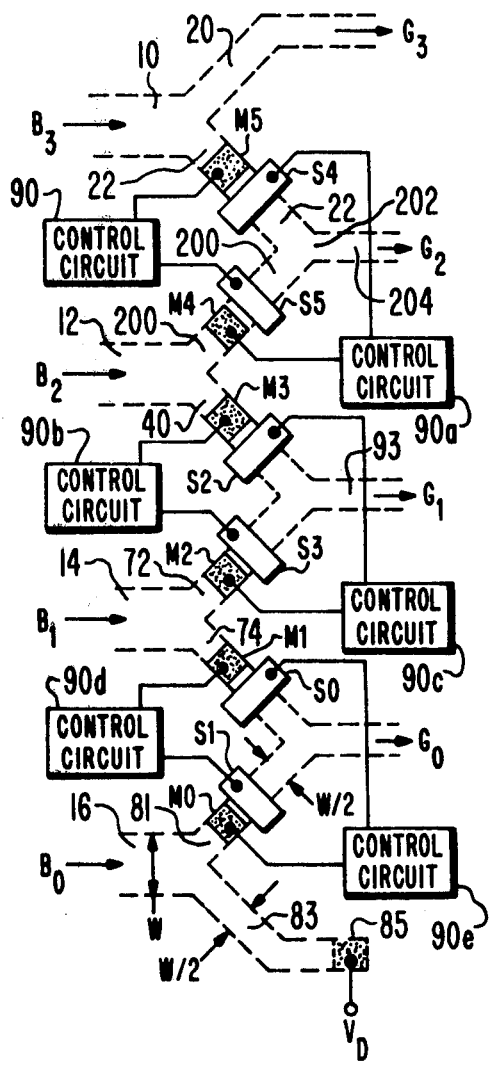
FIG. 6 is a schematic showing of a second form of Gray-to-binary code converter embodying the invention.

A converter embodying the present invention employs charge coupled devices (CCD's). These are illustrated schematically in the various figures which show only the more important ones of the electrodes, some of the diffusions in the substrate, and which show also some of the circuits in block diagram form. The CCD's are assumed to be of the surface channel type with a P-type substrate (N channel). It is to be understood, of course, that this is an example only as the system is equally operative with P-channel, surface channel CCD's and with buried channel CCD's. The substrate is not illustrated but is assumed to be present. The electrodes are illustrated schematically as rectangles. It is to be understood that any of the conventional electrode structures (single layer, double layer, triple layer, and so on) may be employed and further that well-known techniques for obtaining potential barriers, such as ion implants, may be employed where required, and that barriers made in this way may be substituted for the DC biased gate electrodes (D1–D3) illustrated. The channels are illustrated in FIGS. 1 and 6 by dashed lines. Where electrodes for such channels perform their conventional function, in some cases they are not shown and in others some of the electrodes are shown in phantom.

Table I below shows the Gray and binary code equivalents of the decimal numbers 0 through 15.

TABLE I

| DECIMAL | GRAY | | | | BINARY | | | |
|---|---|---|---|---|---|---|---|---|
| | $G_3$ | $G_2$ | $G_1$ | $G_0$ | $B_3$ | $B_2$ | $B_1$ | $B_0$ |
| 0 | 0 | 0 | 0 | 0 | 0 | 0 | 0 | 0 |
| 1 | 0 | 0 | 0 | 1 | 0 | 0 | 0 | 1 |
| 2 | 0 | 0 | 1 | 1 | 0 | 0 | 1 | 0 |
| 3 | 0 | 0 | 1 | 0 | 0 | 0 | 1 | 1 |
| 4 | 0 | 1 | 1 | 0 | 0 | 1 | 0 | 0 |
| 5 | 0 | 1 | 1 | 1 | 0 | 1 | 0 | 1 |
| 6 | 0 | 1 | 0 | 1 | 0 | 1 | 1 | 0 |
| 7 | 0 | 1 | 0 | 0 | 0 | 1 | 1 | 1 |
| 8 | 1 | 1 | 0 | 0 | 1 | 0 | 0 | 0 |
| 9 | 1 | 1 | 0 | 1 | 1 | 0 | 0 | 1 |
| 10 | 1 | 1 | 1 | 1 | 1 | 0 | 1 | 0 |
| 11 | 1 | 1 | 1 | 0 | 1 | 0 | 1 | 1 |
| 12 | 1 | 0 | 1 | 0 | 1 | 1 | 0 | 0 |
| 13 | 1 | 0 | 1 | 1 | 1 | 1 | 0 | 1 |
| 14 | 1 | 0 | 0 | 1 | 1 | 1 | 1 | 0 |
| 15 | 1 | 0 | 0 | 0 | 1 | 1 | 1 | 1 |

It can be seen from the table that the following equations relate the binary digits to the various Gray code digits, where $\oplus$ represents the EXCLUSIVE OR function.

$$G_3 = B_3 \tag{1}$$

$$G_2 = B_2 \oplus B_3 \tag{2}$$

$$G_1 = B_1 \oplus B_2 \tag{3}$$

$$G_0 = B_0 \oplus B_1 \tag{4}$$

The CCD's embodying the present invention perform the binary-to-Gray code translation by implementing the four equations above. Referring now to FIG. 1, a circuit embodying the invention is illustrated in terms of converting a four-digit binary code $B_3 B_2 B_1 B_0$ to a four-digit Gray code $G_3 G_2 G_1 G_0$, where the subscript 3 represents the most significant digit and the subscript 0 the least significant digit. The binary code appears as four charge signals in four separate CCD channels 10, 12, 14 and 16, respectively. Each digit comprises two units of charge when it represents a 1 and substantially less than one unit of charge when it represents a 0. Charges of such magnitudes are easily produced by, for example, introducing charge in some standard way (such as "spill and fill") into CCD channels of the same width, shown here as W, and employing in each channel, electrodes of the same length (where "length" is the electrode dimension in the charge propagation direction).

In the discussion above it is stated that substantially less than one unit of charge represents a 0. In the case of a surface channel device, a 0 may be represented by a small amount of charge, such as 10%–20% of a full well, termed a "fat zero", in order to improve the transfer efficiency, that is, to reduce charge losses during the propagation of charges along a CCD channel due to so-called "fast trapping states" at the substrate surface. This phenomenon is well understood in the art. In the case of a buried channel CCD, the substantially less than one unit of charge referred to may actually be zero charge under optimum conditions. It is to be understood that the expressions in the claim referring, for example, to a "substantial absence of charge" are intended to be generic to these various cases and also to the presence of a small amount of charge due to noise.

Channel 10 divides into two parts at junction 18 and if there is charge present, half the charge flows into the upper channel 20 and the remaining half of the charge into the lower channel 22. The charge in the remaining channels, when present, is also divided in half and sent down two separate channels in similar fashion. Charge in a channel such as 22 adds to the charge in channel 24 at junction 26. The sum charge packet thereby produced is propagated into channel 28 which is of a width W. The assumption made here is that the transfer electrodes (not shown) in channel 28 are of the same length as the transfer electrodes in the input channels such as 10 and 12 and in the channels 22, 24 which are of width W/2.

Each summing channel, such as 28, has associated with it a plurality of electrodes which perform the EXCLUSIVE OR function. The various sets of electrodes are similar and are identified by similar reference characters. As the various sets of electrodes are similar, only the upper set will be discussed in detail. It includes three CCD electrodes, namely A1 followed by D1 followed by M1. It may be assumed that electrode A1 is maintained at a position DC level $V_L$ and is of the same length as electrode M1. Control circuit 30 periodically resets electrode M1 to a DC level $+V_D$ where $V_D$ is slightly greater than $V_L$. At these voltage levels, there are potential wells present in the substrate beneath electrodes A1 and M1, each such well being of a size sufficient to store only one unit of charge. Electrode D1 is maintained at a less positive potential $V_T$ such that there is a potential barrier between the wells beneath electrodes A1 and M1.

The charge in the potential wells just discussed, when such charge is present, periodically is removed from these potential wells and conveyed to two drain regions 31 and 33, respectively. These may comprise diffusions in the substrate of opposite conductivity type than the substrate which are maintained at a positive potential $V_D$. Located between these drains and the electrodes A1 and M1, are two gate electrodes 32 and 34. Their purpose is to permit the transfer of charge from the potential wells beneath the A1 and M1 electrodes to the drains at an appropriate time during the operation of the circuit, as will be discussed shortly.

The electrode M1, which may be considered a master electrode, controls the substrate potential beneath electrode S1, which may be considered a slave electrode. In the present circuit, the charge comprises electrons and when electrons are present in the potential well beneath electrode M1, the slave electrode is driven relatively negative so that a potential barrier is present beneath electrode S1. Conversely, when no charge is present beneath electrode M1, the slave electrode S1 is relatively positive and a potential well or conduction channel is present beneath electrode S1.

Electrode 36 comprises a transfer electrode which is controlled by the voltage $V_P$. When $V_P$ goes relatively positive, a conduction channel forms beneath electrode $V_p$ and if charge is present in the potential well beneath electrode A1, it can flow out of this well, provided slave electrode S1 is relatively positive as will be discussed shortly.

Except for the $\phi_2$ electrodes 38, 38' and 38'' which are shown in phantom, the remaining multiple phase electrodes are not illustrated in FIG. 1. The assumption is that four-phase operation is employed and that the operation of the four electrodes per CCD stage is conventional.

What has just been described is the portions of the CCD which translate the binary code digit $B_3$ to the Gray code digit $G_3$ and which translate the binary code digits $B_3$ and $B_2$ to the Gray code digit $G_2$. The remaining portions of the CCD are similar to those already discussed and are identified by somewhat similar characters. Thus, electrode A2 performs a similar function to electrode A1, electrode D2 performs a similar function to electrode D1, electrode M2 performs a similar function to electrode M1, and so on. All A and M electrodes produce potential wells of the same size; each such well can store only one unit of charge.

The operation of the system of FIG. 1 will be illustrated by giving a specific example and tracing the circuit operation for this example. Assume that the binary code is 1100. The two units of charge representing $B_3$ in channel 10 divide into one unit of charge in channel 20 and one unit of charge in channel 22. The one unit of charge in channel 20 becomes the output Gray code bit $G_3$. As $B_2$ is a 1, there are also two units of charge in channel 12. Half of this charge passes into channel 24 and the other half into channel 40. The one unit of charge in channel 24 adds to the one unit of charge in channel 22 at junction 26 to produce a sum charge packet having two units of charge.

Figure 2:
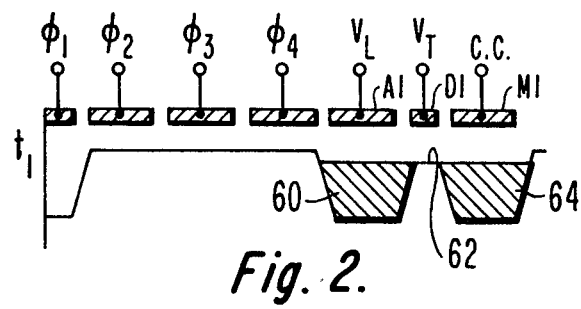
FIG. 2 is a drawing showing a surface potential profile present in a region of the substrate of the system of FIG. 1.
Figure 3:
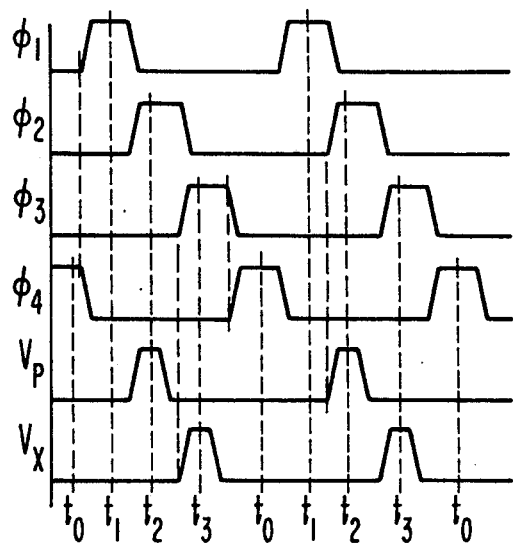
FIG. 3 is a drawing of waveforms employed in the operation of the system of FIG. 1.

Assume now that the CCD previously has been reset, that is, that no charge is present in the potential wells beneath electrodes A1 and M1. Referring briefly to FIGS. 2 and 3, at time $t_0$ when the $\phi_4$ electrode (not shown in FIG. 1 but which is immediately adjacent to the A1 electrode, as shown in FIG. 2) goes positive, the two units of charge present in channel 28 (FIG. 1) flow partially into the potential well beneath the $\phi_4$ electrode and partially into the potential well beneath the A1 electrode. A short time later at $t_1$, when $\phi_4$ goes relatively negative (actually less positive), the charge formerly in the potential well beneath the $\phi_4$ electrode flows into the potential well 60 beneath electrode A1. As there are two units of charge and as the potential well 60 can store only one unit of charge, the charge overflows this well, that is, it flows over the barrier 62 beneath electrode D1 and spills into the potential well 64 beneath master electrode M1. Thus, potential wells 60 and 64 are both filled.

A short time later, as time $t_2$, voltage $V_P$ goes high as shown in FIG. 3 so that a conduction channel is present beneath electrode 36. However, as master electrode M1 is over a potential well which is filled with electrons, it drives the slave electrode S1 relatively negative and the potential barrier thereby created beneath this slave electrode prevents any of the charge in well 60 beneath electrode A1 from passing into the potential well beneath $\phi_2$ electrode 38 (note that at time $t_2$ there is a potential well present beneath the $\phi_2$ electrode 38 as shown in FIG. 3).

As no charge can pass beneath electrode 38, no charge passes into CCD output channel 70. This channel has a width W/2 and the transfer electrodes (not shown) over this channel each have a storage capacity of one unit of charge, the assumption being that these electrodes have the same length as those in channels 12, 24 and 28, as examples. As there is no charge present in channel 70, the Gray code bit $G_2 = 0$.

It has been stated briefly that the binary digit $B_1 = 0$. Accordingly, no charge passes from input channel 14 either to channel 72 or to channel 74. There is one unit of charge present in channel 40. This one unit of charge adds to no charge at junction 76 to produce a sum charge packet of one unit of charge in channel 78. This one unit of charge subsequently is spilled into the potential well beneath electrode A2. However, this potential well has a capacity of one unit of charge so that none overflows the potential barrier beneath electrode D2 and the potential well beneath electrode M2 remains empty. Accordingly, control circuit 30' drives the slave electrode S2 relatively positively, producing a conduction channel beneath this electrode. At time $t_2$, when voltage $V_P$ goes positive, to drive electrode 36' relatively positively, a conduction channel forms beneath electrode 36'. Accordingly, the one unit of charge present in the potential well beneath electrode A2 flows via the conduction channels beneath electrodes 36' and S2 to the potential well beneath $\phi_2$ electrode 38'. This charge eventually is propagated via output channel 80 and becomes the output bit $G_1 = 1$. It can be shown that as $B_0$ and $B_1$ both equal 0, the third EXCLUSIVE OR gate which includes electrodes A3, D3 and M3, produce an output $G_0 = 0$. Thus, the binary code 1100 has been translated to the Gray code 1010 and this is consistent with the table above.

All of the circuits just discussed periodically are reset. The reset may occur at time $t_3$ as shown in FIG. 3. At this time, if there is any charge present beneath an M electrode, it passes to a drain. Note that at time $t_3$, $V_X$ goes high so that conduction paths are present beneath electrodes 32 and 34 and the corresponding electrodes in the EXCLUSIVE OR gates.

In the present system the various CCD channels such as 22, 24, 40 and so on, ,may all be of the same length and the output channels such as 70, 80 and so on also may be of the same length. In the present system, the input binary digits are represented by charge packets each with two units of charge and the output bits are represented by charge packets, each with one unit of charge, in both cases, when the respective charge packets represent a 1. In most applications this is perfectly satisfactory; however, if desired, the Gray code charge packets may be translated to two units of charge each by conventional charge regeneration circuits.

The channel 16 for the least significant binary digit $B_0$ divides into two channels 81 and 83. If any charge is present in channel 83, it is propagated to a drain diffusion 85 which is maintained at a positive potential $V_D$.

FIG. 2 has already been discussed briefly. One set of four multiple phase electrodes is illustrated in this figure and the appropriate waveforms for driving these electrodes are shown in FIG. 3. In the discussion above, when the time $t_0 - t_3$ are discussed, it is to be understood that these times repeat each period.

Figure 4:
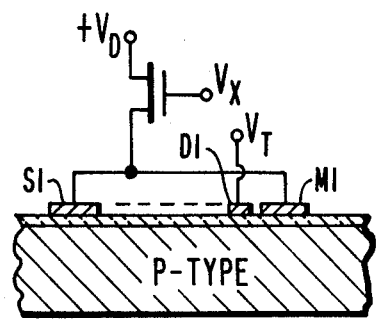
FIG. 4 is a section through a portion of the system of FIG. 1.

FIG. 4 illustrates one form that a control circuit such as 28 may take. Here, the master electrode is a floating gate electrode M1. At time $t_3$, when the $V_X$ is high, the master and slave electrodes M1 and S1, respectively, are both reset to the reference level $+V_D$. Thereafter, both electrodes remain floating with any change in the surface potential beneath the master electrode M1 controlling the potential of the slave electrode S1.

Figure 5:
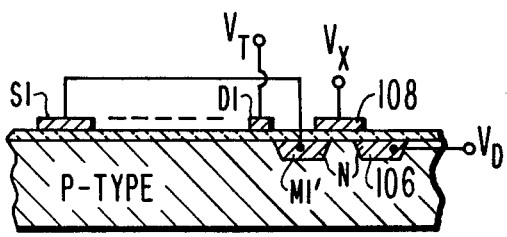
FIG. 5 is a section showing a modified arrangement which performs the same function as what is being shown in FIG. 4.

FIG. 5 illustrates an alternative to the arrangement of FIG. 4. In FIG. 5 rather than using a floating gate electrode M1, a floating diffusion M1' is employed. This floating diffusion periodically is reset at time $t_3$ to the potential $V_D$ of a drain diffusion 106 by applying the pulse $V_X$ to the gate electrode 108. Here the elements 106 and 108 perform the function of control circuit 28 and these elements, in practice, may be elements 33 and 34 of FIG. 1.

FIG. 6 shows a second embodiment of the invention. Here the input charges and input channel dimensions may be similar to what has already been discussed. However, the EXCLUSIVE OR function is performed in the channels of width $W/2$, such as channels 22 and 200. Channel 22 includes in the signal path a floating diffusion M5 of opposite conductivity type than the substrate which serves as a master electrode, and a floating gate S4 which serves as a slave electrode. A control circuit 90 senses the voltage present at a master electrode such as M5 in channel 22 and controls the potential of the corresponding slave electrode S5 in channel 200. In similar fashion, control circuit 90a senses the potential of master electrode M4 in channel 200 and controls the potential of floating gate slave electrode S4 in channel 22.

In operation, assume the same binary input 1100 as in the previous case. The two units of charge in channel 10 subdivide into one unit of charge in channel 20 and one unit of charge in channel 22. The one unit of charge in channel 20 so becomes the $G_3 = 1$ bit.

The one unit of charge in channel 22 is propagated to the floating diffusion M5. In response to the relatively negative potential produced at M5, the control circuit 90 drives slave electrodes S5 relatively negative. In similar fashion, the two units of charge present in input channel 12 subdivide into one unit of charge in channel 200 and one unit of charge in channel 40. The one unit of charge in channel 200 is propagated to the floating diffusion M4 and drives it negative. The control circuit 90a thereupon drives floating electrode S4 negative. As both S4 and S5 are negative, potential barriers are formed beneath these electrodes and no charge passes beyond these electrodes. (The charges present in the floating diffusions M4 and M5 subsequently are disposed of by passing them through transistors corresponding to T3 of FIG. 7, which figure is discussed later, to drain, indicated in FIG. 7 by $V_{DD}$.) Accordingly, at junction 202 where channel 200 and channel 22 converge, a sum charge packet which has zero charge is produced. This sum charge packet propagates to output channel 204 and becomes the Gray code bit $G_2 = 0$.

The one unit of charge present in channel 40 drives master electrode M3 relatively negative. Control circuit 90b therefore drives slave electrode S3 relatively negative. The binary digit $B_1$ is zero so that no charge passes into CCD channel 72 of CCD channel 74. Accordingly, the master electrode M2 remains relatively positive and control circuit 90c holds slave electrode S2 relatively positive. Therefore, there is a conduction channel beneath electrode S2 and the charge present in the floating diffusion M3 eventually propagates to the output CCD channel 93. Thus, the Gray code digit $G_1 = 1$ has been generated.

There is no charge present in channel 74. As $B_0 = 0$, no charge passes into CCD channel 81. Accordingly, the Gray code bit $G_0 = 0$.

The last channel 83 receives a unit of charge whenever $B_0 = 1$. This charge propagates to drain 85 when it is disposed of.

Figure 7:
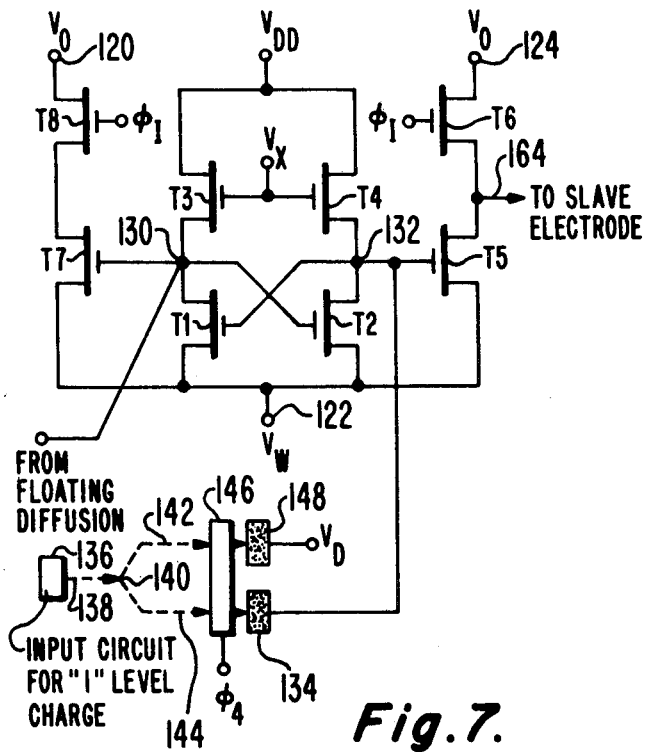
FIG. 7 is a schematic drawing of a control circuit which may be employed in the system of FIG. 6.

The control circuit 90 may be implemented in the manner shown in FIG. 7. This circuit comprises eight transistors T1–T8, respectively. The transistors are all N-channel, field-effect transistors. An all P-channel sense/refresh circuit would be used with the design of a P-channel CCD binary-to-Gray code converter. Transistors T1–T4 all have the same conduction path impedance, when they conduct. Transistors T6 and T8, when they conduct, have much higher conduction path impedances than transistors T5 and T7, respectively, when they conduct. The conduction channels of transistors T7 and T8 are connected in series between terminal 120 for an operating voltage and terminal 122 for a second operating voltage. The conduction channels and transistors T6 and T5 are similarly connected between terminals 124 and 122. The transistors T1–T4 are interconnected to form a balanced detector. The pair T8, T7 matches the pair T6, T5 in electrical characteristics. The only purpose of the pair T8, T7 in the present circuit, is to present a load at node 130 which exactly balances the load at node 132 to assure balanced operation of the decoder.

Figure 8:
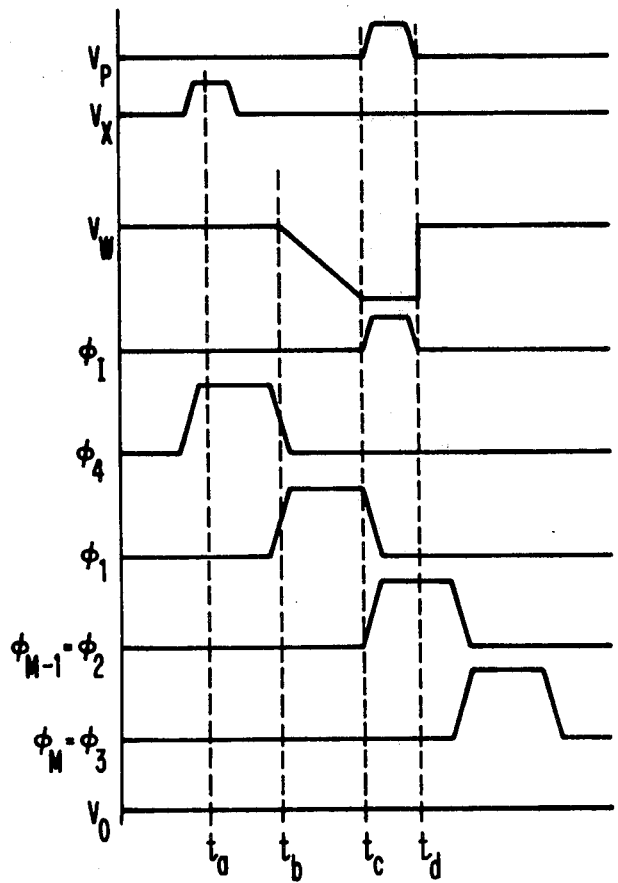
FIG. 8 is a drawing of waveforms employed in the operation of the circuit of FIG. 7.

The operation of the circuit of FIG. 7 may be better understood by referring to FIG. 8. The voltages $V_{DD}$ and $V_O$ are positive DC levels. At time $t_a$, when $V_X$ is high, transistors T3 and T4 are on and circuit nodes 130 and 132 are reset to the $V_{DD}$ reference level. Node 130 is connected to a floating diffusion such as M5 (FIG. 6) and this resets the floating diffusion to this reference voltage level. Node 132 is connected to a floating diffusion 134, so that this diffusion also is reset to the $V_{DD}$ reference level. Thereafter, $V_X$ goes low, turning off transistors T3 and T4. A charge signal concurrently is being propagated from an input circuit for a one level charge, shown schematically as a block 136, down a CCD channel 138. This channel divides into two channels at point 140. One half the charge then propagates to the upper channel 142 and the other half to the lower channel 144.

At a later time $t_b$, during the falling edge of pulse $\phi_4$, the charge signal present in channel 144 is transferred to the floating diffusion 134. This changes the voltage at 132 by an amount $\Delta V_1/2$ so that node 132 is established at the reference level $V_{DD}-(\Delta V_1 2.)$At the same time, the charge present in channel 142 is shifted to a drain diffusion 148 where it is conducted away.

At time $t_b$, charge present beneath a $\phi_4$ electrode (not shown) adjacent to a floating diffusion such as M5 is conducted to the floating diffusion such as M5. This floating diffusion is directly connected to node 130 of the differential signal detector of FIG. 7. Assume that the charge (electrons) represents a 1 and that it is therefore greater than one-half the charge required to represent a binary 1.

Recapitulating what has occurred to this point, node 132 has been set to a reference level equal to $V_{DD}-(\Delta V_1/2.)$ Node 130 in this example has been placed at a voltage level $V_{DD-\Delta V_2}$, where $V_2 > (\Delta V_1/2)$.

At time $t_b$, the voltage $V_W$ applied to terminal 122 which connects to the source electrodes of transistor T1 and T2, starts to go negative (actually less positive) from its high level of $V_{DD}$. This voltage is of a sense to tend to turn on transistors T1 and T2. Node 130 connects to the gate electrode of transistor T2 and node 132 to the gate electrode of transistor T1. As node 130 is more negative than node 132 in this example, transistor T1 will tend to turn on before transistor T2. In due course a point will be reached at which this, in fact, does occur. Transistor T1 goes on and conduction occurs through this transistor. That is, electrons flow from terminal 122 to node 130 making node 130 even more negative. This more negative voltage at node 130 maintains transistor T2 off. Thus, the circuit has assumed a condition at which node 130 follows the negative voltage level $V_W$ and node 132 remains at the reference level $V_{DD}-(\Delta V_1/2)$.

The circuit is in this condition at time $t_c$, when $V_W$ is at its most negative level. Immediately thereafter, the pulse $\phi_I$ occurs and this turns on transistor T6. Transistor T5 also is on at this time. Therefore, conduction occurs from terminal 124 through the condition paths of transistor T6 and T5 to terminal 122. As already mentioned, transistor T5, when it conducts, has a relatively low conduction path impedance and transistor T6, which operates as a load, has a relatively high conduction path impedance. (Such low and high impedances readily are obtained during the manufacturing process by appropriate selection of the conduction path dimensions.) Thus, when $\phi_I$ occurs, the voltage at output lead 164 goes close to the most negative $V_W$ level.

As may be seen in FIG. 8, the positive-going level $\phi_2$ occurs immediately after time $t_c$. In the example being discussed, at time $t_c$ a voltage close to $V_W$ is present on output lead 164 at this time. This voltage is selected to be sufficiently negative to create a potential barrier beneath slave electrode S5 of FIG. 6 of sufficient height to prevent the passage of charge from floating diffusion M4 in channel 200 to beneath the first multiple phase electrode, which may be a $\phi_2$ electrode (not shown), following slave electrode S5. Thus, no substantial charge (equivalent to zero) is propagated to this channel.

Suppose now that the charge which had been propagated to the floating diffusion M5 were less than one-half that required to represent a binary 1, that is, suppose the charge represented a binary zero. In this case the balanced detector would have been switched to its second state during the period between times $t_b$ and $t_c$, that is, transistor T1 would have remained off and transistor T2 would have been turned on. This means that node 132 would be at the most negative $V_W$ level at time $t_c$. In this case, transistor T5 would remain off when the positive $\phi_I$ pulse occurs so that lead 164 is placed at the positive $V_0$ level when the pulse $\phi_I$ occurs. This positive level is chosen to be sufficiently high to create a conduction path beneath slave electrode S5. Accordingly, if there is charge present on floating diffusion M4 and no charge present of floating diffusion M5 of FIG. 6, then when $\phi_I$ goes positive between times $t_c$ and $t_d$, charge is conducted via the conduction path beneath slave electrode S5 to the potential well beneath the $\phi_2$ electrode (not shown) following S5. Note that at time $t_c$, the multiple phase voltage $\phi_2$ goes positive creating a storage potential well beneath the $\phi_2$ electrode (not shown) immediately adjacent to 55.

Any charge which passes to the $\phi_2$ electrode storage potential well in channel 200 subsequently is propagated along the CCD channel to the merge or junction point 202 and thence to the output CCD channel 204 for Gray code bit $G_2$.

The invention has been illustrated in terms of the conversion of a four-digit binary code to a four-bit Gray code. This embodiment is particularly useful as it may also be employed for binary-coded decimal to Gray code conversions. However, it is to be understood that the circuit illustrated is just one example as the invention is applicable to the conversion of more or fewer than four binary code digits to a corresponding number of Gray code digits.

The circuit of FIG. 7 has been discussed in terms of the control circuits 90 of FIG. 6. This form of control circuit is equally useful as the control circuits 30 of FIG. 1.

What is claimed is:

1. A charge-coupled device (CCD) binary-to-Gray code converter comprising, in combination:

N input CCD channels for N charge signals $B_{N-1}$... $B_0$ indicative of an N digit binary code, where $B_{N-1}$ represents the digit of greatest significance and $B_0$ the digit of least significance, each such charge signal comprising a packet of charge of the same size;

means for dividing each charge packet substantially in half, one half of the charge packet $B_{N-1} = (B_{N-1}/2)$ comprising a charge packet representing the Gray code digit $G_{N-1}$ of greatest significance; and $N-1$ means, each means for adding a different half charge packet $B_j/2$ to a half charge packet $B_{j-1}/2$, in EXCLUSIVE OR fashion, each such means for producing a different output charge packet $G_{j-1}$, indicative of the $(j-1)$'th Gray code digit, where $j$ is an integer having the values $(N-1) \ldots 1$.

2. A CCD binary-to-Gray code converter as set forth in claim 1, wherein each means for adding in EXCLUSIVE OR fashion comprises:

means for adding a half charge packet $B_j/2$ to a half charge packet $B_{j-1}/2$ to obtain a sum packet $S_{j-1}$;

another CCD channel;

means for producing first and second serially occurring potential wells, in said other channel, in that order, separated from one another by a potential barrier, each such well having a capacity equal to substantially one half of the maximum value of a sum charge packet $S_{j-1}$;

means for spilling said sum charge packet $S_{j-1}$ into said another channel, whereby if said charge packet $S_{j-1}$ is at its maximum value, that charge fills said first potential well, overflows said barrier, and fills said second potential well, and if said charge packet $S_{j-1}$ is at substantially half its maximum value, only said first potential well becomes filled, and if said sum charge packet has a substantially smaller amount of charge, neither potential well becomes filled;

an output CCD channel;

means responsive to the presence of substantial charge in said second potential well for preventing the charge in said first potential well from being propagated to said output CCD channel; and means for propagating the charge in said first potential well to said output channel only when there is substantial charge in said first potential well and a substantial absence of charge in said second potential well.

3. A CCD binary-to-Gray code converter as set forth in claim 2, wherein said means responsive to the presence of substantial charge in said second potential well comprises a master electrode which is electrically coupled to said second potential well, and means including a slave electrode over said output CCD channel, responsive to the potential of said master electrode for creating a potential barrier in said output CCD channel for preventing the passage of charge when said second potential well contains a substantial amount of charge.

4. A CCD binary-to-Gray code converter as set forth in claim 1, wherein each means for adding an EXCLUSIVE OR fashion comprises:

first and second signal processing CCD channels;

a floating semiconductor region followed by a floating gate electrode in each signal processing channel;

means for setting all floating gates and floating regions to a reference level such that the floating regions are receptive of charge and potential well are present beneath said floating gates in both signal processing channels;

means for concurrently propagating said charge packet $B_j/2$ to the floating region in said first signal processing CCD channel and said charge packet $B_{j-1}/2$ to the floating region in said second signal processing CCD channel;

means responsive to the presence of substantial charge $B_j/2$ at the floating region in said first signal processing CCD channel for controlling the potential of the floating gate of said second signal processing CCD channel so as to form a potential barrier in said second signal processing CCD channel to prevent the passage of charge;

means responsive to the presence of substantial charge $B_{j-1}/2$ at the floating region in said second signal processing CCD channel for controlling the potential of the floating gate of said first signal processing CCD channel so as to form a potential barrier in said first signal processing CCD channel to prevent the passage of charge; and an output CCD channel for receiving and propagating the charge, if any, which is propagated past the floating gate electrodes of said signal processing channels.

5. A charge-coupled device (CCD) binary-to-Gray code converter comprising, in combination:

N input CCD channels for N charge signals $B_{N-1} \ldots B_0$ indicative of an N digit binary code, where $B_{N-1}$ represents the digit of greatest significance and $B_0$ the digit of least significance, each such charge signal comprising a packet of charge of the same size;

means for dividing each charge packet substantially in half, one half of the charge packet $B_{N-1} = (B_{N-1}/2$ comprising a charge packet representing the Gray code digit $G_{N-1}$ of greatest significance;

$N-1$ means, each means for adding a different half charge packet $B_j/2$ to a half charge packet $B_{j-1}/2$, to produce the $N-1$ sum charge packets $S_{N-2} \ldots S_0$, where $j$ is an integer having the values $N-1 \ldots 1$; and $N-1$ logic means, each logic means for deriving from a different sum charge packet $S_{j-1}$ a charge packet $G_{j-1}$, indicative of the $(j-1)$'th Gray code digit.

6. A CCD binary-to-Gray code converter as set forth in claim 5, wherein each logic means comprises:

means responsive to a sum charge packet of maximum value for producing an output $G_{j-1}$ indicative of binary zero;

means responsive to a sum charge packet of substantially half the maximum value for producing an output $G_{j-1}$ indicative of binary 1; and means responsive to a sum charge packet having substantially less than one quarter of said maximum value for producing an output $G_{j-1}$ indicative of binary zero.

* * * * *

UNITED STATES PATENT AND TRADEMARK OFFICE
CERTIFICATE OF CORRECTION

PATENT NO. : 4,119,961

DATED : October 10, 1978

INVENTOR(S) : Leonard Richard Rockett, Jr.

It is certified that error appears in the above-identified patent and that said Letters Patent is hereby corrected as shown below:

Column 3, line 14, "position" should be --positive--.

Column 4, line 36, "as" (first occurrence) should be --at--.

Column 7, line 27, "$V_{DD}-(\Delta V_1 2.)$" should be --$V_{DD}-\Delta V_1/2.$--.

Column 7, line 41, "$V_{DD-\Delta}V_2,$" should be --$V_{DD}-\Delta V_2,$--.

Column 7, line 64, "condition" should be --conduction--.

Column 9, line 7, "$B_{J-1}/2,$" should be --$B_{j-1}/2,$--.

Signed and Sealed this

Tenth Day of April 1979

[SEAL]

Attest:

RUTH C. MASON
*Attesting Officer*

DONALD W. BANNER
*Commissioner of Patents and Trademarks*